United States Patent
Von Soosten et al.

(10) Patent No.: US 12,334,618 B2
(45) Date of Patent: Jun. 17, 2025

(54) ROLLED OR FOLDED FILTER COMPRISING A FLEXIBLE PRINTED CIRCUIT BOARD HAVING FIRST ELONGATE SIGNAL TRACKS COVERED BY AN ELECTROMAGNETICALLY ABSORBING MATERIAL

(71) Applicant: QM Technologies ApS, Ballerup (DK)

(72) Inventors: Merlin Von Soosten, Copenhagen S (DK); Ferdinand Kuemmeth, Copenhagen N (DK); Anders Kuhle, Vanlose (DK); Martin Skjodt, Rodovre (DK); Jonatan Kutchinsky, Ballerup (DK); Peter Ulrik Kann, Farum (DK)

(73) Assignee: QM TECHNOLOGIES APS, Ballerup (DK)

( * ) Notice: Subject to any disclaimer, the term of this patent is extended or adjusted under 35 U.S.C. 154(b) by 274 days.

(21) Appl. No.: 17/794,371

(22) PCT Filed: Jan. 22, 2021

(86) PCT No.: PCT/EP2021/051489
§ 371 (c)(1),
(2) Date: Jul. 21, 2022

(87) PCT Pub. No.: WO2021/148626
PCT Pub. Date: Jul. 29, 2021

(65) Prior Publication Data
US 2023/0057594 A1     Feb. 23, 2023

(30) Foreign Application Priority Data
Jan. 24, 2020   (EP) .................................. 20153633

(51) Int. Cl.
*H01P 1/203* (2006.01)
*H01P 11/00* (2006.01)
*H05K 1/02* (2006.01)

(52) U.S. Cl.
CPC ...... *H01P 1/20345* (2013.01); *H01P 1/20381* (2013.01); *H01P 11/007* (2013.01);
(Continued)

(58) Field of Classification Search
CPC .. H01P 1/20345; H01P 1/203; H01P 1/20381; H01P 11/007
(Continued)

(56) References Cited

U.S. PATENT DOCUMENTS

| 7,893,792 B2 | 2/2011 | Hwang et al. |
| 8,159,313 B2 | 4/2012 | Uchaykin |

(Continued)

FOREIGN PATENT DOCUMENTS

| JP | H06216606 A | 8/1994 |
| WO | 0184663 A1 | 11/2001 |
| WO | 2011095206 A1 | 8/2011 |

OTHER PUBLICATIONS

Mueller et al., "Printed Circuit Board Metal Powder Filters for Low Electron Temperatures," Review of Scientific Instruments, vol. 84, No. 4, Apr. 30, 2013, 14 pages.

Karnaushenko et al., "Rolled-up Self-Assembly of Compact Magnetic Inductors, Transformers and Resonators," Cornell University Library, May 2, 2018, 19 pages.

(Continued)

*Primary Examiner* — Benny T Lee
(74) *Attorney, Agent, or Firm* — Workman Nydegger

(57) ABSTRACT

A filter comprising a flexible PCB with one or more signal tracks on one side. A electromagnetically absorbing material covers the signal tracks. An insulating material may be provided between the signal tracks and the electromagnetically absorbing material. The PCB is then folded or rolled to take up less space. The PCB may be first folded and then (Continued)

rolled to have both ends of the signal tracks available at the outer portion of the roll.

13 Claims, 3 Drawing Sheets

(52) U.S. Cl.
CPC ....... *H05K 1/028* (2013.01); *H05K 2201/051* (2013.01); *H05K 2201/055* (2013.01); *H05K 2201/056* (2013.01)

(58) Field of Classification Search
USPC .......................................................... 333/204
See application file for complete search history.

(56) References Cited

U.S. PATENT DOCUMENTS

| | | |
|---|---|---|
| 9,521,743 B2 | 12/2016 | Fischeneder et al. |
| 10,390,423 B1 | 8/2019 | Olivadese |
| 2007/0131446 A1 | 6/2007 | Jurek |
| 2008/0284545 A1 | 11/2008 | Keefe et al. |
| 2013/0043961 A1 | 2/2013 | Gebauer et al. |
| 2014/0266513 A1* | 9/2014 | Abraham et al. ......... H01P 3/06 29/601 |

OTHER PUBLICATIONS

International Search Report from corresponding PCT Application No. PCT/EP2021/051489, Apr. 23, 2021.

* cited by examiner

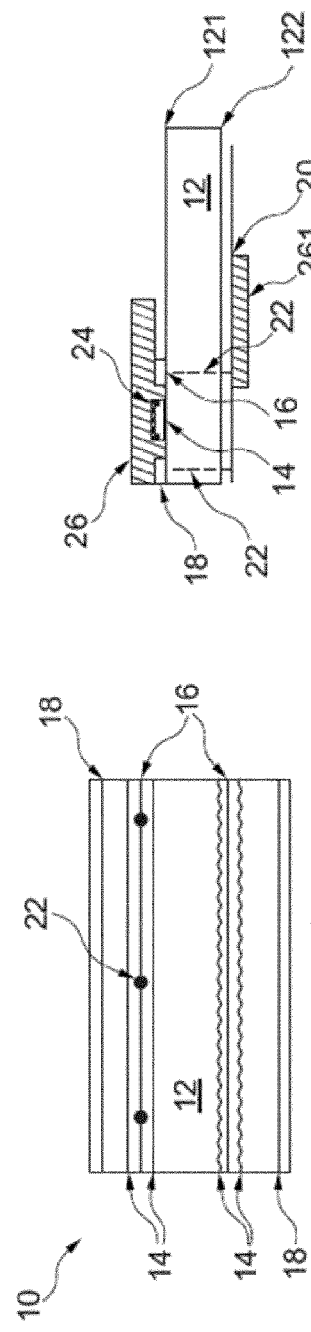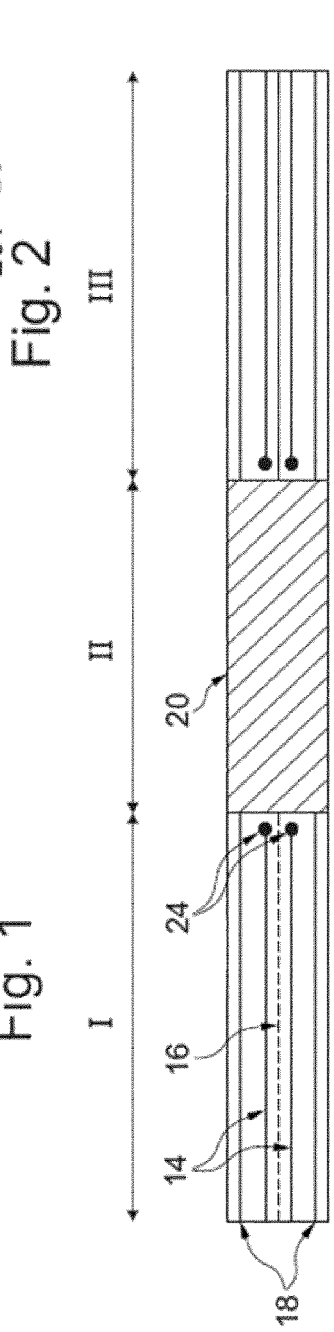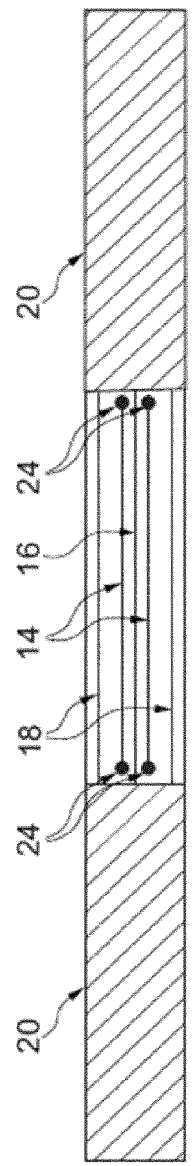

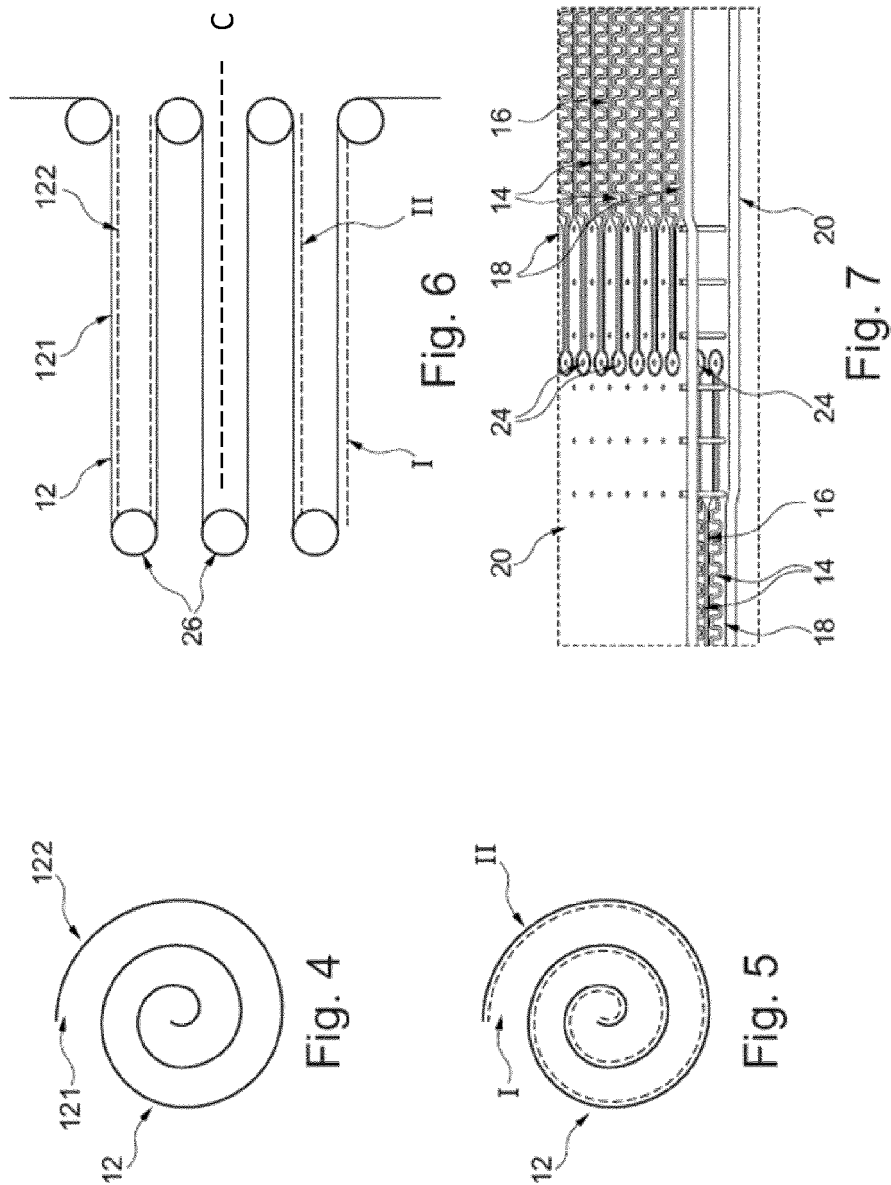

ROLLED OR FOLDED FILTER COMPRISING A FLEXIBLE PRINTED CIRCUIT BOARD HAVING FIRST ELONGATE SIGNAL TRACKS COVERED BY AN ELECTROMAGNETICALLY ABSORBING MATERIAL

BACKGROUND

The present invention relates to a filter with a lower real estate use, which may be used for low temperatures, such as for reducing the effective electron temperature in signal transport to/from quantum computer processors. The same filter may be used for other low temperature physics set-ups, such as spectroscopy. Quantum computers today operate at temperatures below 1K, where other technologies may operate at considerably higher temperatures, such as 100K.

The project leading to this application has received funding from the European Union's Horizon 2020 research and innovation programme under grant agreement No 946372.

Filters may be seen in e.g. "Printed circuit board metal powder filters for low electron temperatures" by Mueller et al, Review of scientific instruments, 84, 044706 (2013), "Rolled-up self-assembly of compact magnetic inductors, transformers and resonators", Karnaushenko et al, arxiv.org, Cornell university library, 2 May 2018, issued U.S. Pat. No. 8,159,313, published US Patent Application no. 2008/0284545, issued U.S. Pat. No. 10,390,423, issued U.S. Pat. No. 7,893,792, published US Patent Application no. 2013/0043961, and issued U.S. Pat. No. 9,521,743.

SUMMARY OF THE INVENTION

In a first aspect, the invention relates to a filter comprising:
- a flexible printed circuit board (PCB) comprising one or more first elongate signal tracks, each signal track formed by an electrically conducting path on a first surface of the printed circuit board, and
- a first electromagnetically absorbing material covering the first elongate signal tracks, wherein the printed circuit board is:
- folded to form at least two at least substantially parallel printed circuit board portions and/or rolled into a roll.

In the present context, a filter is a circuit which is configured to adapt an electrical signal travelling through the filter. In the present context, the filter may be adapted to reduce the electron temperature of signals transported thereby. In addition, the filter may be a low pass filter if desired.

The present filter is a single-channel or multi-channel filter having one or more signal tracks. Each signal track may transport a signal or a flow of electrons.

The signal track is/are provided on a printed circuit board which may be an element having the signal tracks on a surface thereof. Each signal track is elongate, meaning that it has a length which is longer, such as at least 10 times longer, than its width. The signal tracks may be provided on a surface of the PCB, such as attached thereto. The PCB may have a core material of a material which is not electrically conducting, such as a material which has a conductivity of no more than 0.0001 S/m, such as no more than 0.001 S/m, at room temperature and/or at temperatures below 100K, such as at temperatures below 1K. Suitable core materials may be polymers, PTFE, SiO, ceramics, glass, semiconductor materials or composites. Naturally, the PCB may have a core of a flexible material, such as a material easily permanently deformed, such as a metal. In that situation, the PCB may be permanently deformed to maintain the rolled/folded shape.

The printed circuit board is flexible or bendable. In this connection, a flexible/bendable PCB is bendable 180 degrees over a radius of no more than 20 mm, such as no more than 10 mm, such as no more than 5 mm, such as no more than 3 mm, without damage to PCB core material and conducting material. With a flexible PCB, the PCB may be rolled or folded so that the longest (Euclidian) dimension of the overall filter may be reduced. Naturally, the flexibility of the PCB may be at any desired temperature, such as at room temperature, an elevated temperature or at a lower temperature. The PCB may be brought to the desired temperature where it is folded/rolled and then subsequently heated/cooled for mounting or the like if required. This is explained further below. The signal track is/are made of an electrically conducting material, such as a material having a conductivity of at least 100 S/m, such as at least 200 S/m, such as at least 300 S/m, such as at least 500 S/m, such as at least 1000 S/m at room temperature and/or at temperatures below 100K or below 1K. Suitable materials may be: Cu, Au, Ag, C, Al or the like. Actually, it may be desired to use, for one or more signal tracks, a resistive material with a conductivity less than e.g. 10 S/m in (part of) the signal line. In this manner, the signal track will operate as an in-line RC filter with the electromagnetically absorbing material as the capacitive medium.

The signal track(s) may be straight or meandering. Preferably, if multiple signal tracks are provided, the signal tracks are more or less parallel, so each signal track extends from one end or portion of the PCB to another end or portion thereof. Preferably, each signal track is not galvanically connected to any other signal track. In addition, preferably the signal tracks do not overlap. Then, a signal travelling in one signal track may not be able to directly travel to another signal track. The lack of a galvanic connection may mean that a signal in one signal track may be substantially attenuated if transferred to another signal track. Between two signal tracks, a resistance of 100 MOhm or more, such as 1 GOhm or more, such as 100 GOhm or more at cryogenic temperatures.

A shielding track may be provided between adjacent signal tracks and may be a solid material or a porous material, such as a powder. The PCB may, at the position of a shielding track, have a groove or an opening or channel through which the shielding track, such as powder, may extend from the first surface, such as between the signal tracks, and into the PCB material and potentially all the way to or through the PCB.

Finally, a first electromagnetically absorbing material is covering the first elongate signal tracks. Preferably, the first electromagnetically absorbing material is in close contact with the signal tracks. Preferably the absorbing material is not galvanically connected to the signal tracks even though electrons may move between the signal tracks and the absorbing material. The electromagnetically absorbing material may be provided on a side of the PCB with the first signalling tracks, such as adhered to that side of the PCB.

In the present context, an electromagnetically absorbing material may comprise a powder, nanoparticles, fibres, sheets, nanotubes, Buckminsterfullerene(s), wires or the like-combined or not, of a metal, such as Cu, Au, Ag, Al, Stainless Steel, Brass or the like, a doped or undoped semiconductor or semiconductor composite, such as of Si, Ge, C, Sb, InSb or combinations thereof, or of graphene, graphite or carbon, such as carbon nanotubes (multi walled if desired). In addition or alternatively, the electromagnetically absorbing material may comprise a super conducting material or a magnetic material, such as Iron oxides, Ferrite, Magnetite or other magnetic materials.

The powder/nanoparticles/fibres/sheets/nanotubes or the like preferably comprises a material with a conductivity of at least 1 S/m, such as at least 10 S/m, such as at least 100 S/m at room temperature and/or a temperature below 100K or below 1K.

The powder/nanoparticles/fibres/sheets/nanotubes or the like may have particles with a particle size, such as a mean value of the largest dimension of the particles, below 1000 μm, such as below 500 μm, such as below 250 μm, such as below 100 μm, such as below 50 μm, such as below 25 μm.

In addition, the electromagnetically absorbing material may comprise a structural matrix in addition to the above material(s), such as a resin, such as an epoxy resin, a polymer (Silicone, Poly(methyl methacrylate), Vinyl or the like), a metal, or a ceramic (AlO, HfO or the like) or a combination thereof. The matrix may act to fix the above material(s) in relation to each other or in relation to e.g. the signal tracks or the PCB.

In addition, the structural matrix may have the function of optimizing the electro-magnetic absorption and the thermal conductivity of the electromagnetically absorbing material. For example, the thermal conductivity of the matrix may be adapted to arrive at a desired combined thermal conductivity of the electromagnetically absorbing material. Also, the electromagnetic absorption may be tailored by the choice of the dimensions, concentration of and material of the powder, fibres, sheets or the like as described above.

The electromagnetically absorbing material may be attached to the PCB, such as by a glue or the like. Naturally, the electromagnetically absorbing material may be attached to the PCB by the electromagnetically absorbing material itself being adhesive or having been made adhesive, such as if the above structural matrix has this property. It is preferred, however, that the signal tracks are not galvanically connected to each other through the electromagnetically absorbing material. In some embodiments, the electromagnetically absorbing material may be comprise the above structural matrix, such as a glue or adhesive, such as epoxy resins, silicones or the like, so that it may be applied on to the PCB and allowed to dry/solidify/harden.

The interaction between the electrons in the signal tracks and the electromagnetically absorbing material may reduce the electron temperature of the signals in the signal tracks.

The printed circuit board is:
folded to form at least two at least substantially parallel printed circuit board portions and/or rolled into a roll.

The PCB is flexible and thus able to be bent into a folded and/or rolled shape. This shape allows the PCB to be longer and still not take up so much real estate, such as in a cooled space at a quantum computer. The structure with the electromagnetically absorbing material still makes it possible to obtain the desired filtering operation. Also, cooling may be performed via the electromagnetically absorbing material by thermally anchoring the electromagnetically absorbing material and/or portions of the PCB.

The electromagnetically absorbing material may be applied to the PCB in a homogenous thickness before the folding or rolling to achieve a reproducible thickness in production. The electromagnetically absorbing material may be applied to the PCB after mounting the PCB in a pre-defined configuration to achieve a reproducible filling in production. Adding rigid spacers in a regular or irregular pattern on the PCB may facilitate a rolling or folding with a defined distance between layers.

Below, different alternative manners of providing the absorbing material are described.

The electromagnetically absorbing material may fix the folded/rolled PCB after solidifying, such as if provided between adjacent layers of the PCB. Thus, the electromagnetically absorbing material will both cause the sought after filtering and a fixing and securing of the PCB.

Clearly, a folded PCB will have two or more portions which may be parallel. Such portions need not, however, be straight. The folded PCB may subsequently be e.g. rolled to form a roll of these two portions, as will be described below.

In this context, a roll is a structure where the PCB is bent toward itself. A helical coil is a rolling, where the PCB is folded around an axis with the same diameter. Another type of roll will be as a roll of tape, where the PCB is folded over itself around an axis but with an increasing diameter.

Additionally, the PCB may be folded/rolled in a manner that supresses inductive noise from external (electro-) magnetic fields, examples for this are folding in a zig-zag manner, or by rolling a folded PCB. Providing a coiled conductor in a magnetic field clearly will generate a current in the conductor. Reversing the direction of the conductor for a portion of its length will reduce this current-suppressing such induced noise.

Preferably, the filter has a first electrically insulating material between the first elongate signal tracks and the first electromagnetically absorbing material, In this manner, interconnection of signal tracks via any conducting material in the electromagnetically absorbing material is prevented, and the first electromagnetically absorbing material may have a large concentration of the conducting or semiconducting material if desired. Then, the first electrically insulating material may cover the elongate signal tracks. This first insulating material preferably has a conductivity below 0.001 S/m, such as below 0.0001 S/m at room temperature and/or below 100K or below 1K. Suitable materials may be polymers, plastics, glasses, ceramics or the like. This material ensures that the elongate signal tracks are not short circuited by the electromagnetically absorbing material.

Also, the electromagnetically absorbing material may then be attached to or fixed to the first electrically insulating material instead of the PCB.

In one embodiment, the printed circuit board comprises at least two sections along a longitudinal direction, wherein:
in a first section:
the first elongate signal track(s) and the first insulating material are provided at the first side of the printed circuit board and
in a second section adjacent to the first section, the filter comprises:
one or more second elongate signal tracks each formed by an electrically conducting path on a second surface of the printed circuit board, the second side being opposite to the first side, and
a second electromagnetically absorbing material covering the second elongate signal tracks, and
where a first signal track is connected to a second signal track.

Thus, the above filter structure is provided in the first section. In the second section, the structure is mirrored, so that the tracks are now on the other side. Also, the functionality of the electromagnetically absorbing material and insulating material of the second section are as those of the first section.

Now, a first signal track is connected to a second signal track. This may be obtained by providing an electrical connection through the PCB material. Preferably, if multiple first tracks are provided, each first signal track is connected to a separate second signal track. Then, the number of second signal tracks may be the same as the number of first signal tracks.

A second electromagnetically absorbing material is provided covering the second elongate signal tracks to provide the same advantage, and/or have the above properties, as the first electromagnetically absorbing material provided on the first insulating material. The second electromagnetically absorbing material may be the same as, or have the same properties as, the first electromagnetically absorbing material and/or any electrically conducting or semiconducting material may be the same in the first and second electromagnetically absorbing materials.

As noted above, a second electrically insulating material may be provided between the second electromagnetically absorbing material and the second elongate signal tracks. The second electrically insulating material may have the same properties as described above for the first insulating material. Clearly, the second and first electrically conducting materials may be the same.

This PCB may be used in interesting manners as will be described below.

In one embodiment, flexible printed circuit board is folded to form at least two at least substantially parallel printed circuit board portions.

When the PCB is folded at a position between the first and second sections, the second side of the PCB will face the first side. Preferably, the folding is provided between the first and second sections, so that one section will have the tracks face the conductive layer of the other section. In this manner, the tracks of one section will not face the tracks of the other section. This aids in reducing cross talk between the tracks of different sections.

In that or another embodiment, the flexible printed circuit board is rolled into a roll. Rolling the PCB may be performed so that the first side faces the inner portion of the roll, for example.

However, simply rolling the PCB from one end to the other may have the disadvantage that one end of the signal tracks is engageable at the centre of the roll. Also in this configuration, a coil is formed which is more sensitive to external (electro-) magnetic noise, or may be a source of electro-magnetic noise itself. If this is not desired, the PCB may first be folded as described and then rolled so that the folded portion is at the centre of the roll. The folding will again ensure that no side with the tracks faces another side with tracks, furthermore both ends of the signal tracks are available at the outer end of the roll.

In one embodiment, a plurality of first signal tracks are provided so that multiple signals may be transported and filtered. Below, additional tracks and layers are described which may be provided to prevent cross talk between signal tracks.

In one embodiment, the filter further comprises a first electrically conducting or absorbing layer on a second surface of the printed circuit board, the first and second sides being opposite sides of the printed circuit board. The first conductive layer overlaps the first signal track(s) in a projection on to the first side, so that signals travelling from the signal track(s) perpendicularly into the PCB will impinge on the conductive layer.

In this connection, the first and second sides are opposite sides of the PCB. Preferably, these two sides are the two main sides or the two sides of the PCB with the largest surfaces. PCBs often are flat and thin elements having two main sides and a low thickness compared to any dimensions of the main sides.

The first side of the PCB preferably has a largest dimension being no less than 10 times, such as no less than 100 times, larger than the dimension perpendicular to the first side, often being the thickness.

Preferably, the first layer covers or overlaps, such as completely encompasses, when projected on to the first surface or a plane parallel to the first surface, the signal tracks also projected on to the plane. In this manner, the first plane will ensure that no signals form the signal tracks are able to leave the filter in the direction from the signal tracks through the PCB.

A preferred embodiment of the filter further comprises a third electromagnetically absorbing material in contact with the first electrically conducting/absorbing layer. Naturally, the third electromagnetically absorbing material may be the same as the first electromagnetically absorbing material. The third electromagnetically absorbing material may have the above properties and may comprise the same electrically conducting or semiconducting material as the first and/or second electromagnetically absorbing material. The third electromagnetically absorbing material may be attached to the first layer, such as in the same manner as the first electromagnetically absorbing material may be attached to the PCB or first insulating material. The third electromagnetically absorbing material may be used for transporting cooling to the first electrically conducting/absorbing layer.

It may be desired that the first electrically conducting/absorbing layer is in galvanic contact with the third electromagnetically absorbing material. This provides a better energy/cooling transfer, as the electromagnetically absorbing material may then be connected or connectable to a cooling surface in a system wherein the filter is used.

In order to facilitate cooling of the filter, cooling elements or thermally conducting elements may be provided in the electromagnetically absorbing material. Such cooling elements preferably are thermally conductive, such as if made of a metal, and may extend from inside the electromagnetically absorbing material to close to an outer surface thereof or to surroundings of the material.

In the folded embodiment, the cooling element(s) may be provided in the absorbing material between two adjacent portions of the PCB. In the rolled embodiment, the cooling element may be a layer provided in the absorbing material between adjacent windings of the roll.

In that or another embodiment, one or more portions of the PCB, such as one or more portions thermally and/or electrically connected to the first electrically conducting or absorbing layer, may extend away from the PCB, potentially through a layer of absorbing material, to surroundings of the filter. Such portion(s) may then be cooled, transferring cooling into the roll/folded structure.

The filter may further, when multiple sections are provided, comprise, in the second section, a second electrically conducting or absorbing layer on the first surface of the printed circuit board. Also, a fourth electromagnetically absorbing material may be provided to have the advantages described above for the first layer and third electromagnetically absorbing material.

In one embodiment, the first and/or second insulating material has a thickness of 0.001-3000 µm, such as 0.005-1000 µm, such as 0.01-500 µm, such as 0.05-300 µm, such as 0.1-100 µm.

A second aspect of the invention relates to a method of providing the filter according to any of the first and second aspects of the invention, the method comprising:
  providing a flexible printed circuit board comprising one or more first elongate signal tracks each formed by an electrically conducting path on a first surface of the printed circuit board,
  providing a first electromagnetically absorbing material covering the first elongate signal tracks, and
  folding the printed circuit board to form at least two at least substantially parallel printed circuit board portions.

The embodiments, considerations and the like of the above aspects are equally valid for the present aspect of the invention.

The providing of the flexible PCB may be as known in the art: the PCB material may originally be provided with the first and optionally also second sides covered by the desired conducting material, where after undesired portions thereof is removed to form the tracks. Alternatively, a core material may be provided of the PCB on to which the tracks may be provided in any desired manner.

The first electromagnetically absorbing material may be attached to the PCB such as by being self-adhesive, such as if the electromagnetically absorbing material comprises an adhesive. Alternatively, a separate adhesive may be provided between the electromagnetically absorbing material and the PCB.

The absorbing material may be provided as a solid element, such as one or more monolithic elements which is/are provided at the PCB. The solid element(s) may be biased toward the PCB, such as using a spring element, or may be attached to the PCB such as using an adhesive. In the folded version, the PCB may be folded around an absorbing element, such as around multiple absorbing elements which will then each be provided between adjacent portions of the PCB.

Such solid elements may be cast, moulded or printed, such as screen printed or 3D printed.

The element may be hard/unflexible or soft/flexible. A soft or flexible element may be provided at the PCB before rolling/folding so that the element is rolled/folded with the PCB to be provided between neighbouring windings or portions of the rolled/folded PCB.

Another aspect of the invention relates generally to a PCB comprising at least one electrical conductor, rolled, folded, straight or having any other shape, and which is attached to a solid element which is electromagnetically absorbing. This PCB and electromagnetically absorbing material may be as described below and above, and this aspect clearly may be combined with any of the other aspects, embodiments, situations and the like.

Alternatively, the absorbing material may be screen printed or painted/lacquered directly on the PCB. An aspect of the invention relates to a PCB as described in relation to any of the other aspects, embodiments and situations of the application, onto which is screen printed, painted or lacquered an electromagnetically absorbing material, such as a material comprising an adhesive and a powder of an absorbing or conducting material. This material may be as described above and below.

Another alternative is one where a slurry of particles and a liquid, such as an adhesive or the like, is added to or at the PCB, often in the rolled/folded position, where the liquid of the slurry has a sufficiently low viscosity to allow the particles to move according to gravity (or a force generated such as by rotation) and settle in one portion of the volume receiving the slurry. Often, the particles have a density larger than that of the liquid. In this manner, the concentration of the powder may be higher in this portion after settling than the concentration in the initial slurry. Yet another aspect of the present invention relates to a method of providing an electromagnetically absorbing element onto or at a PCB comprising at least one conductor or signal track, the method comprising adding a slurry, comprising an adhesive liquid and a powder of an electromagnetically absorbing or electrically conducting material, at or on the PCB and allowing the powder to settle in a portion of a volume into which the slurry is provided, before the adhesive sets or hardens (and thus prevents further movement of the powder). Clearly, this aspect may be combined with any of the other aspects, embodiments, situations or the like. The method may further comprise the later step of removing a portion of the set adhesive in a volume away from or different from the portion in which a main portion of the powder has settled. Often, the PCB will be provided in a container into which the slurry is provided. The PCB may be provided below a height, in the container, to which the slurry is filled, so that an upper part of the set adhesive may be removed without removing part of the PCB.

The folding may be performed at a predetermined position of the PCB. Often, the PCB is folded on to itself to form two parallel portions. The PCB preferably is elongate and folded around an axis perpendicular to the longitudinal axis.

The folding may provide two more or less parallel portions which have equal length, if desired. Alternatively, the lengths may be different.

In one embodiment, an insulating material is provided between the first electromagnetically absorbing material and the first electrically conducting signal tracks, such as as a layer of e.g. a lacquer or polymer. Spraying, painting, laminating or the like may be used. The material may cover all of the first side and optionally also the second side, or only the tracks, if desired. The first electromagnetically absorbing material may then be attached to this insulating material, which may be adhesive. If sections as described above are provided, an even number of sections may be provided, so that, along at least most of the folded structure, one portion has signal track(s) facing the other portion where signal track(s) face away from the one portion. Overlapping parts may be seen where signal tracks are provided on both the first and second sides, such as where they are connected, such as through the PCB material. Even or uneven numbers of sections may be used in e.g. zig-zag shaped foldings.

In one embodiment, the method comprises subsequently rolling the folded printed circuit board into a roll. The rolling may be in the manner of a roll of tape.

Preferably, both section ends are engageable from outside of the roll.

Another aspect of the invention relates to a method of providing the filter according to any of the first and second aspects of the invention, the method comprising:
  providing a flexible printed circuit board comprising one or more first elongate signal tracks each formed by an electrically conducting path on a first surface of the printed circuit board,
  providing a first electromagnetically absorbing material covering the first elongate signal tracks, and
  rolling the printed circuit board into a roll.

The embodiments, considerations and the like of the above aspects are equally valid for the present aspect of the invention.

Again, an electrically insulating layer may be provided between the first signal tracks and the first electromagnetically absorbing material.

Thus, the rolling may be performed also with an un-folded PCB. In this manner, the first side of the PCB will face the second side when the rolling is in the manner of a roll of tape.

If the rolling is in the form of a helical coil, the first or second side will face the inner axis of revolution.

A final aspect of the invention relates to a method of using the filter according to any of the first and second aspects of the invention, the method comprising:

cooling the first electromagnetically absorbing material and the first electrically conducting signal tracks to a temperature below 100K, and feeding signals through the first electrically conducting signal tracks.

The embodiments, considerations and the like of the above aspects are equally valid for the present aspect of the invention.

The cooling step may be obtained by having the electromagnetically absorbing material contact a cooling surface of a system comprising a receiver for the signals, such as a quantum processor core, which may also be desired cooled.

BRIEF DESCRIPTION OF THE DRAWINGS

In the following, preferred embodiments will be described with reference to the drawing, wherein:

FIG. 1 illustrates a PCB structure for use in a first embodiment of the invention, FIG. 2 illustrates the structure of FIG. 1 seen from the end, FIG. 3 illustrates a structure for use in a second embodiment of the invention, FIG. 4 illustrates a filter according to a third embodiment of the invention, FIG. 5 illustrates a filter according to a fourth embodiment of the invention FIG. 6 illustrates a filter according to a fifth embodiment of the invention, FIG. 7 illustrates an interface useful in the embodiment according to FIG. 3.

DETAILED DESCRIPTION OF VARIOUS EMBODIMENTS

Figure 9:
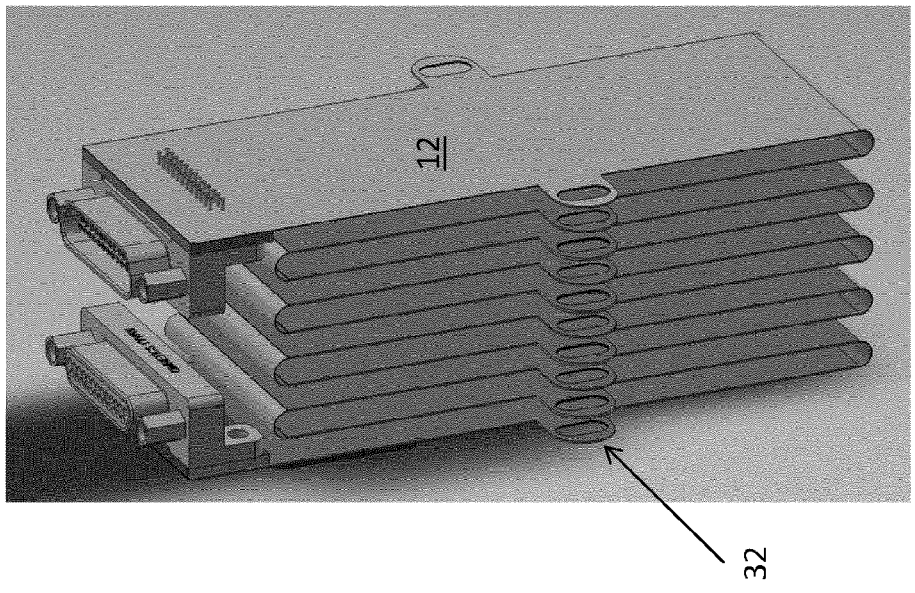
FIG. 9 illustrates a folded PCB structure with cooling fins.

In FIG. 1, a PCB structure 10 for use in a filter is illustrated which is formed by a printed circuit board, or PCB, 12 having thereon a plurality of elongate signal tracks 14. A number of elongate shielding tracks 16 and two outer shielding tracks 18 may be provided along with a number of vias 22.

The tracks 14 are covered by an insulating material 24 (see FIG. 2), and an electromagnetically absorbing material 26 (see FIG. 2) of an electrically conducting material is provided on the insulating material.

A filter structure of this type is used for e.g. conditioning electric signals for a quantum computer processor. Then, the filter is cooled to less than 1K, such as less than 10 mK.

In FIG. 1, two different shapes of the tracks 14 are illustrated—a straight shape and a sine-shaped or more meandering shape. Any shape or combination of shapes may be used. These include meandering and sine-shapes with multiples of different pitches, or random lines to reduce resonance effects.

Preferably, the signal tracks 14 extend at least substantially parallel so as to not overlap. Also, this may allow a shielding track 16 to be provided there between in order to prevent cross talk from one signal track 14 to another. Clearly, signal tracks 14 may be meandering and an equally meandering shielding conductor may be provided there between, but any shape, including straight, are useful.

Naturally, any number of signal tracks 14 may be provided. Preferably, a shielding track 16 is provided between each pair of neighbouring signal tracks 14. Also, preferably, outer tracks 18 are provided. Also, neighbouring tracks 14 may be aligned intentionally to reduce crosstalk and noise, i.e. by aligning a meandering pattern in phase or out of phase.

The tracks 14, as well as optional tracks 16 and 18, are provided on a first side 121 (see FIG. 2) of the PCB.

As shown in FIG. 2, on the other side 122 of the PCB 12, a conducting layer 20 may be provided which preferably covers all of the second side of the PCB or at least all of an area of the first side on which the tracks 14, 16 and 18 are provided (when projected on to a plane of the first side 121. The layer 20 may alternatively be made of an absorbing material such as a super conductor or a powder-filled material.

In this manner, the signal tracks 14 can be covered at all sides by the layer 20, the outer tracks 18, the shielding tracks 16 and the layer 20 and electromagnetically absorbing material 26.

FIG. 2 illustrates the filter structure 10 of FIG. 1 seen from the end, such as from the left. A number of the tracks and some of the electromagnetically absorbing material have been left out, but the upper outer tracks 18, signal tracks 14 and shielding tracks 16 are illustrated. It is seen that an electrically insulating material 24 is provided on the signal track 14 so as to prevent direct contact between the electromagnetically absorbing material and the signal conductor.

The insulating material may also be provided over the outer tracks 18 and/or the shielding tracks 16, but this is not required. A better cooling is seen when these tracks are in direct, galvanic contact with the electromagnetically absorbing material.

The same is the situation for the layer 20 which may be used also for cooling, so that it is preferably un-isolated and in galvanic contact with the electromagnetically absorbing material or another layer 261 of electromagnetically absorbing material at the second side 122 of the PCB 12.

Furthermore layer 20 may be thermally anchored to the cooling system to provide optimal cooling of the electromagnetically absorbing material in contact with the layer.

Often the electromagnetically absorbing material comprises a glue, such as epoxy, or other fluid so as to be fixed in relation to the layers and not shift during thermal cycling (heating and cooling). Also, later compaction of e.g. a loose powder may generate voids which could generate less cooling to certain elements in the filter structure.

In order to obtain a better cooling and shielding/grounding of the shielding tracks, vias 22 may be provided from the shielding tracks to the plane 20. Vias may also be provided from the outer tracks to the plane if desired.

The filter structure of FIGS. 1 and 2 is illustrated as a straight structure. However, as the PCB 12 is flexible, it is configured to be bent/rolled, deformed or shaped in other manners in order to take up less space, such as if made very long. Often, it is desired that the tracks 14, or the PCB 12, have a length of more than 10 cm, such as longer than 50 cm, such as longer than 100 cm.

In FIG. 4, an embodiment of the invention is illustrated wherein the filter structure has a coiled shape. When the PCB 12 is coiled, the first side 121 (see FIGS. 2 and 6) with the tracks 14/16/18 faces the second side 122 (see FIGS. 2 and 6) with the layer 20, so that the isolation or shielding, if desired, is maintained. In this manner, the tracks 14 are engageable at one end at the inner portion of the coil and at the other end at the outer portion of the coil. In one embodiment, the filter is bent at the center thereof (as explained below in relation to FIG. 5) and rolled so that both ends of the tracks 14 are engageable from the outer portions of the coil. In this case, however, the first side will be facing the first side, which may not be preferred, at least if no electromagnetically absorbing material is present between the facing first sides.

In FIG. 3, another of a filter structure may be seen which has three sections, I, II and III. In the upper illustration, the first side, 121 (see FIG. 2), is seen and in the lower illustration, the other side 122 (see FIG. 2) is seen. Sections I and II are of the type seen in FIG. 1 where the tracks 14, 16 and 18 are provided on the first side 121 and the plane on the second side 122.

In section II, however, the tracks 14, 16 and 18 are provided on the second side 122 and the layer on the first side 121.

Vias 24 are provided for connecting a track 14 in section II with a track 14 in section I and in section III. Vias 22 (see FIGS. 1 and 2) may also be used for connecting the tracks 16 and 18 to the corresponding tracks in the other sections, but these vias may additionally or alternatively be connected directly to the plane 20 in the neighbouring section.

Clearly, the vias 22 described in relation to FIGS. 1 and 2 for connecting the tracks 16/18 to the plane 20 through the PCB may also be provided.

A filter structure of this type may be used in a number of manners. One manner is seen in FIG. 5, where a filter according to the invention is seen with two sections, such as sections I and II of FIG. 3, where the sections I and II have the same length. The PCB 12 is then folded at the center, i.e. at a position of the vias 24, where after the folded PCB is coiled. In this manner, both outer ends of the tracks 14 are engageable at the outer portions of the coil. In addition, due to this structure of the sections, the folding will have the layer 20 of section II face the tracks 14 of section I (see FIG. 3), so that the coiling again will have the tracks face the layer, so that optimal shielding is obtained. Clearly, also 4, 6 or any other even number, for rolls, of sections may be used.

A preferred manner of interfacing between the sections and the two sides is seen in FIG. 7, in which like reference characters refer to like elements of FIG. 3.

In FIG. 6, another filter is seen in which the PCB 12 is zig-zagged or guided over a number of pins 26 each folding the PCB 12 gently by 180 degrees. The equidistant positioning of the pins has the advantage that the distance between the parallel portions of the PCB 12 are equidistant. Alternatively, the pins may be positioned with a lower distance, making the PCB define more wedge-shaped portions, thereby making the overall filter smaller. The pins 26 may be omitted and the PCB folded over itself or over other types of elements. Equidistance may be provided using only the electromagnetically absorbing material, for example. Any number of sections may be used in this context.

In this embodiment, the electromagnetically absorbing material may be dosed/poured/casted/fed/filled into a casing also comprising the pins and the PCB. The electromagnetically absorbing material may have a higher or lower viscosity. If the viscosity is low, it may be desired to provide the electromagnetically absorbing material on both sides of the PCB in order to prevent that the PCB ends up in a shape different from a straight line between the pins.

The upper portion of FIG. 6 illustrates how the second side 122 will face the same side after a bend around a pin 26, if no sections are used. Naturally, around the next bend, the first sides 121 will then face each other.

At the lower portion of FIG. 6, it is illustrated how the embodiment of FIG. 3 will act, when the sections I and II are made to intersect at the pin 26. In this manner, the second side will always face the first side. In this manner, the number of sections will correspond to the number of parallel portions of the filter in the set-up. In FIG. 6, this number would be 6.

Naturally, the electromagnetically absorbing material is preferred also in the coiled/folded embodiments, but the absorbing material may not be required in the situations where the layer of the second surface 122 faces the first layer tracks in close proximity (where sections are provided, for example), as the layer will then perform the shielding function which the electromagnetically absorbing material would perform in the straight case.

In general, the PCB may require or prefer being heated or otherwise softened prior to and/or during bending/folding. The PCB may be rigid or fragile when in room temperature, where the softening may be chemical (addition of a softener, such as oil, phthalates or the like) or heating.

The PCB may have a core material which is permanently deformable, so that the bent/folded state is maintained once provided. Alternatively, the folded/bent shape may be maintained by adhesion, such as by the electromagnetically absorbing material adhering the portions of the PCB in the desired relative positions.

In another alternative embodiment, the absorbing material may be a paint or lacquer which may be applied on the PCB.

In another embodiment, the absorbing material is provided as a slurry of a powder and a liquid. The liquid may be an adhesive, as it may be able to harden or set.

Figure 8:
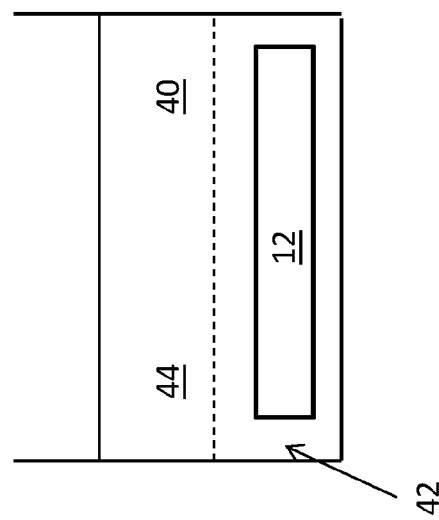
FIG. 8 illustrates a container for providing an absorbing material to a PCB.

The PCB 12, folded/rolled or straight, may be provided in a container (see FIG. 8) into which the slurry 40 is provided. Upon pouring into the container, the powder of the slurry will settle at the bottom and thus around the filter, generating a lower portion 42 with a higher concentration of the powder than the original slurry, and an upper portion 44 with a lower concentration of the powder. Thus, the filter may be provided with (or inside) a material with a high powder concentration.

When the liquid has hardened or set, the portion 44 may be removed if desired, or the absorbing material around the PCB 12 may be machined to arrive at a desired size.

Preferably, the PCB and the signal tracks are cooled to close to 0K. In this connection, the function of the absorbing material may be to absorb energy from electrons travelling in the signal track. This absorbed energy will heat the absorbing material and is preferably removed. The absorbing material may have a high thermal conduction and thus be able to transport such energy to a surface thereof, such as a surface connected to a cooling surface. Alternatively or additionally, cooling elements or thermal conductors may be provided in the absorbing material, such as the layer C of FIG. 6 or a laminated layer between the windings of the coils of FIGS. 4 and 5. This layer C may merely extend inside the absorbing material to distribute or transport the energy therein, such as to a surface of the absorbing material. Alternatively, the layer C may extend to outside of the absorbing material in order for itself to be cooled, such as if connected to a cooling surface.

In FIG. 9, another or an alternative cooling manner may be seen in which the PCB 12 itself is provided with cooling fins 32 which may extend into the absorbing material, if provided also at the width of the PCB, or to the surroundings of the PCB or filter structure to be cooled, such as by connection to a cooling surface. The fins 32 may be connected to the signal track(s) but preferably are extensions of the layer 20 (see FIGS. 2, 3 and 7) so as to be able to cool a larger portion of the PCB.

The invention claimed is:

1. A filter comprising:
   a flexible printed circuit board comprising one or more first elongate signal tracks, each of the one or more first elongate signal tracks formed by an electrically conducting path on a first surface of the printed circuit board, and
   a first electromagnetically absorbing material covering the one or more first elongate signal track(s),
   wherein the printed circuit board is:
   folded to form at least two substantially parallel printed circuit board portions and/or
   folded over itself around an axis and with increasing diameter to form a roll.

2. The filter according to claim 1, wherein the one or more first elongate signal tracks comprises a plurality of first elongate signal tracks.

3. The filter according to claim 1, further comprising a first electrically conducting or absorbing layer on a second surface of the printed circuit board, the first and second surfaces being opposite surfaces of the printed circuit board, the first layer overlapping the one or more first elongate signal track(s) in a projection on to the first surface.

4. The filter according to claim 3, further comprising a third electromagnetically absorbing material contact with the first electrically conducting or absorbing layer.

5. A method of using the filter according to claim 1, the method comprising:
   cooling the first electromagnetically absorbing material and the one or more first elongate signal tracks to a temperature below 100K, and
   feeding signals through the one or more first elongate signal tracks.

6. The filter according to claim 1, further comprising a first electrically insulating material between the one or more first elongate signal track(s) and the first electromagnetically absorbing material.

7. The filter according to claim 6, wherein the printed circuit board comprises at least two sections along a longitudinal direction, wherein:
   in a first section:
      the one or more first elongate signal track(s) and the first insulating material are provided at the first surface of the printed circuit board and
   in a second section adjacent to the first section, the filter comprises:
      one or more second elongate signal tracks, each second elongate signal track formed by an electrically conducting path on a second surface of the printed circuit board, the second surface being opposite to the first surface, and
      a second electromagnetically absorbing material covering the one or more second elongate signal track(s),
      and where a first elongate signal track of the one or more first elongate signal track(s) is connected to a second elongate signal track of the one or more second elongate signal track(s).

8. The filter according to claim 7, further comprising, in the second section, a second electrically conducting or absorbing layer on the first surface of the printed circuit board.

9. The filter according to claim 7, further comprising a second electrically insulating material between the second electromagnetically absorbing material and the one or more second elongate signal tracks.

10. The filter according to claim 7, wherein the printed circuit board is folded at a position between the first and second sections.

11. A method of providing a filter, the method comprising:
    providing a flexible printed circuit board comprising one or more first elongate signal tracks, each of the one or more first elongate signal tracks formed by an electrically conducting path on a first surface of the printed circuit board,
    providing a first electromagnetically absorbing material covering the one or more first elongate signal tracks, and
    folding the printed circuit board to form at least two at least substantially parallel printed circuit board portions.

12. The method according to claim 11, further comprising the step of rolling the folded printed circuit board into a roll.

13. A method of providing a filter, the method comprising:
    providing a flexible printed circuit board comprising one or more first elongate signal tracks, each of the one or more first elongate signal tracks formed by an electrically conducting path on a first surface of the printed circuit board,
    providing a first electromagnetically absorbing material covering the one or more first elongate signal tracks, and
    folding the printed circuit board over itself around an axis and with increasing diameter to form a roll.

\* \* \* \* \*